United States Patent
Watanabe et al.

(10) Patent No.: US 7,666,571 B2
(45) Date of Patent: Feb. 23, 2010

(54) POLYMER, RESIST COMPOSITION AND PATTERNING PROCESS

(75) Inventors: Takeru Watanabe, Joetsu (JP); Seiichiro Tachibana, Joetsu (JP); Takao Yoshihara, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 132 days.

(21) Appl. No.: 11/589,109

(22) Filed: Oct. 30, 2006

(65) Prior Publication Data
US 2007/0099114 A1    May 3, 2007

(30) Foreign Application Priority Data
Oct. 31, 2005    (JP) ............... 2005-316400

(51) Int. Cl.
C08F 18/20    (2006.01)
G03F 7/00     (2006.01)
G03F 7/004    (2006.01)

(52) U.S. Cl. .............. 430/270.1; 430/322; 430/326; 526/245

(58) Field of Classification Search ........... 430/270.1, 430/326, 322; 526/245, 247
See application file for complete search history.

(56) References Cited

U.S. PATENT DOCUMENTS 4,491,628 A    1/1985    Ito et al.

(Continued)

FOREIGN PATENT DOCUMENTS

JP    63-27829 A    2/1988

(Continued)

OTHER PUBLICATIONS

H. Ito et al.; "Dissolution/swelling behavior of cycloolefin polymers in aqueous base", Proceedings of SPIE, vol. 3999, pp. 2-12, 2000.

(Continued)

*Primary Examiner*—Cynthia H Kelly
*Assistant Examiner*—Anca Eoff
(74) *Attorney, Agent, or Firm*—Westerman Hattori, Daniels & Adrian, LLP

(57) ABSTRACT

A polymer of which dissolution rate in an alkaline developer increases under the action of acid comprises recurring units having formulae (1) and (2) wherein $R^1$, $R^2$, and $R^4$ are H or methyl, $R^3$ is difluoromethyl or trifluoromethyl, and X is tertiary alkyl. A resist composition comprising the polymer has a high sensitivity and resolution, decreased pattern collapse during development, and minimized MEF and is best suited as micropatterning material for the VLSI manufacture.

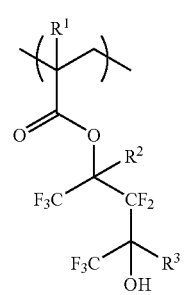

(1)

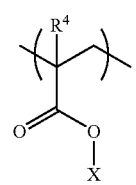

(2)

6 Claims, 1 Drawing Sheet

EXAMPLE 1 MEF

U.S. PATENT DOCUMENTS

| | | | |
|---|---|---|---|
| 5,310,619 | A | 5/1994 | Crivello et al. |
| 6,200,725 | B1 | 3/2001 | Takechi et al. |
| 6,280,898 | B1 | 8/2001 | Hasegawa et al. |
| 6,448,420 | B1 | 9/2002 | Kinsho et al. |
| 2001/0026901 | A1 | 10/2001 | Maeda et al. |
| 2001/0055726 | A1* | 12/2001 | Kanna et al. ............ 430/270.1 |
| 2002/0031718 | A1* | 3/2002 | Hashimoto et al. ....... 430/270.1 |
| 2003/0078352 | A1* | 4/2003 | Miyazawa et al. .......... 526/245 |
| 2005/0019696 | A1* | 1/2005 | Allen et al. .............. 430/281.1 |
| 2005/0058938 | A1* | 3/2005 | Tachibana et al. ........ 430/270.1 |
| 2007/0122736 | A1* | 5/2007 | Hatakeyama et al. .... 430/270.1 |

FOREIGN PATENT DOCUMENTS

| | | |
|---|---|---|
| JP | 2-27660 B2 | 6/1990 |
| JP | 9-73173 A | 3/1997 |
| JP | 9-90637 A | 4/1997 |
| JP | 9-230595 A | 9/1997 |
| JP | 10-10739 A | 1/1998 |
| JP | 2000-26446 A | 1/2000 |
| JP | 2000-159758 A | 6/2000 |
| JP | 2000-327633 A | 11/2000 |
| WO | WO 97/33198 A1 | 9/1997 |

OTHER PUBLICATIONS

H. Ito et al.; "Fluoropolymer Resists: Progress and Properties"; Journal of Photopolymer Science and Technology; vol. 16, No. 4, pp. 523-536, 2003.

K. Kudo et al.; "Enhancement of the Senesitivity of Chemical-Amplification-Type Photoimaging Materials by β-Tosyloxyketone Acetals"; Journal of Photopolymer Science and Technology, vol. 8, No. 1, pp. 45-46, 1995.

Koji Arimitsu et al.; "Sensitivity Enhancement of Chemical-Amplification-Type Photoimaging Materials by Acetoacetic Acid Derivatives"; Journal of Photopolymer Science and Technology, vol. 8, No. 1, pp. 43-44, 1995.

Koji Arimitsu et al.; "Effect of Phenolic Hydroxyl Residues on the Improvement of Acid-Proliferation-Type Photoimaging Materials"; Journal of Photopolymer Science and Technology, vol. 9, No. 1, pp. 29-30, 1996.

* cited by examiner

EXAMPLE 1 MEF

POLYMER, RESIST COMPOSITION AND PATTERNING PROCESS

CROSS-REFERENCE TO RELATED APPLICATION

This non-provisional application claims priority under 35 U.S.C. §119(a) on Patent Application No. 2005-316400 filed in Japan on Oct. 31, 2005, the entire contents of which are hereby incorporated by reference.

This invention relates to (1) novel polymers suitable for use as the base resin in resist compositions for lithographic micropatterning, (2) resist compositions comprising the same, and (3) a patterning process using the resist compositions.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF laser (193 nm) is expected to enable miniaturization of the design rule to 0.13 µm or less. Since conventionally used novolac resins and polyvinylphenol resins have very strong absorption in proximity to 193 nm, they are difficult to use as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

Among others, a focus is drawn on (meth)acrylic resin base resists featuring a high resolution. One of the (meth)acrylic resins proposed thus far is a combination of (meth)acrylic units having methyladamantane ester as acid labile group units with (meth)acrylic units having lactone ring ester as adhesive group units as disclosed in JP-A 9-90637. Acid labile groups of exo form are described in U.S. Pat. No. 6,448,420 (JP-A 2000-327633). These groups have so high an acid lability and require a low level of activation energy for acid elimination, affording a high resolution and low dependence on post-exposure bake (PEB). Norbornane lactone is also proposed as an adhesive group having enhanced etching resistance as disclosed in JP-A 2000-26446 and JP-A 2000-159758.

Of the outstanding tasks associated with the ArF lithography, it is desired to minimize the mask error factor (MEF) and to prevent pattern collapse during development. When the line width of the mask is changed 1 nm, the MEF is an index of a change (in nm) in the line width of the corresponding resist. The MEF requirement becomes stricter as the pattern rule becomes finer. On the other hand, the pattern collapse is a phenomenon that the resist pattern collapses by a capillary force during the spin development step. One factor causing the pattern collapse is swelling during development. While the polyhydroxystyrene used as the resist for the KrF lithography, in which the phenol moiety is a weak acidic group and has an appropriate alkali solubility, is resistant to swelling, the ArF lithography uses polymers containing hydrophobic cycloaliphatic groups, which must be dissolved using carboxylic acids having a high acidity, leading to a likelihood for the polymers to swell during development.

The development performance of resists can be quantified by the quartz crystal microbalance (QCM) technique. The quantity of swell during development is reported in Proc. SPIE Vol. 3999, p 2 (2000). Although the swelling of a film being developed could not be observed by the prior art film thickness measurement relying on optical interference, the QCM technique designed to electrically measure any change of film weight enables to observe any weight increase of swollen film. The cited reference discusses the swelling of ArF resists based on cycloolefin polymers. Substantial swells are observed when carboxylic acid is used as the adhesive group.

For the $F_2$ lithography, resists using hexafluoroalcohol have been studied. As used herein, the term "hexafluoroalcohol" refers to an alcohol having total six fluorine atoms on the carbon atoms located adjacent the alcoholic carbon. It is reported in J. Photopolym. Sci. Technol., Vol. 16, No. 4, p 523 (2003) that hexafluoroalcohol has an acidity approximate to that of phenol and is least swollen in a developer liquid. Also known are polynorbornene having hexafluoroalcohol and α-trifluoromethyl acrylate having hexafluoroalcohol pendants. It was reported how these polymers perform when exposed to ArF excimer laser light.

SUMMARY OF THE INVENTION

An object of the invention is to provide a chemically amplified positive resist composition which, when processed by photolithography, offers decreased pattern collapse during development, a minimized MEF, a significantly high contrast in alkaline dissolution rate before and after exposure, a high sensitivity, and a high resolution, so that it is suited as a micropatterning material for the manufacture of VLSI or the formation of photomask patterns.

Another object of the invention is to provide a novel polymer suitable for use as the base resin in the resist composition.

A further object of the invention is to provide a process for forming a pattern using the resist composition.

The inventors have found that the effects of preventing the pattern collapse during development and minimizing the MEF are exerted when a polymer comprising an ester form having a specific fluorinated alkyl alcohol structure and an ester form having a tertiary alkyl ester structure is used as the base resin.

Accordingly, the present invention provides a polymer, a positive resist composition comprising the same, and a patterning process using the resist composition.

A first embodiment of the invention is a polymer having a rate of dissolution in an alkaline developer that increases under the action of acid, the polymer comprising recurring units having the general formulae (1) and (2), the recurring units being of at least one type for each formula:

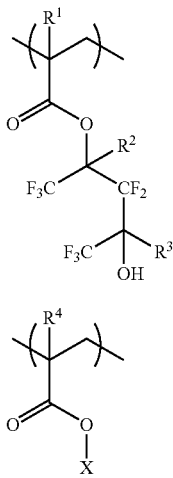

(1)

(2)

wherein $R^1$, $R^2$, and $R^4$ are each independently hydrogen or methyl, $R^3$ is difluoromethyl or trifluoromethyl, and X is a tertiary alkyl group.

A second embodiment of the invention is a polymer having a rate of dissolution in an alkaline developer that increases under the action of acid, said polymer comprising recurring units having the general formulae (1) to (3), the recurring units being of at least one type for each formula:

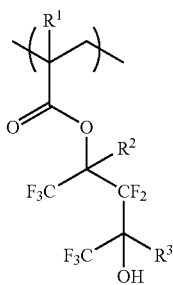

(1)

(2)

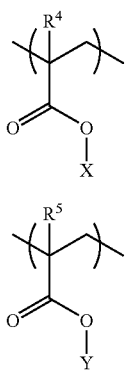

(3)

wherein $R^1$, $R^2$, $R^4$ and $R^5$ are each independently hydrogen or methyl, $R^3$ is difluoromethyl or trifluoromethyl, X is a tertiary alkyl group, and Y is a monovalent group having a lactone structure.

A third embodiment of the invention is a polymer having a rate of dissolution in an alkaline developer that increases under the action of acid, said polymer comprising recurring units having the general formulae (1) to (4), the recurring units being of at least one type for each formula:

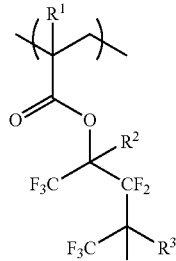

(1)

(2)

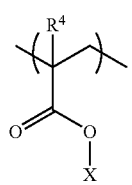

(3)

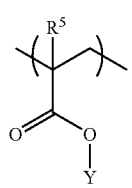

(4)

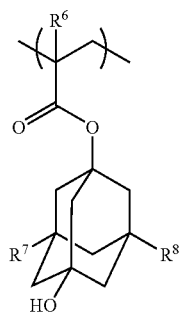

wherein $R^1$, $R^2$, $R^4$, $R^5$, and $R^6$ are each independently hydrogen or methyl, $R^3$ is difluoromethyl or trifluoromethyl, $R^7$ and $R^8$ are each independently hydrogen or hydroxyl, X is a tertiary alkyl group, and Y is a monovalent group having a lactone structure.

In the above embodiments, the polymers preferably have a weight average molecular weight of 1,000 to 50,000, wherein the recurring units of formula (1) are incorporated in a molar fraction of 2% to 70% and the recurring units of formula (2) are incorporated in a molar fraction of 10% to 70%.

In another aspect, the invention provides a resist composition comprising the polymer of any of the foregoing embodiments. Specific embodiments include a resist composition comprising (A) the polymer, (B) an acid generator, and (C) an organic solvent; a resist composition comprising (A) the polymer, (B) an acid generator, (C) an organic solvent, and (D) an organic nitrogen-containing compound; and a resist composition comprising (A) the polymer, (B) an acid generator, (C) an organic solvent, (D) an organic nitrogen-containing compound, and (E) a surfactant.

In a further aspect, the invention provides a process for forming a pattern comprising the steps of (1) applying the resist composition defined above onto a substrate to form a coating, (2) heat treating and exposing the coating to high-energy radiation having a wavelength of up to 300 nm or electron beams through a photomask, (3) heat treating and developing the coating with a developer.

It is noted that immersion lithography can be applied to the resist composition of the invention. The ArF immersion lithography uses deionized water as the immersion solvent. The immersion lithography involves prebaking a resist film and exposing the resist film to light through a projection lens, with water interposed between the resist film and the projection lens. This technology, combined with a projection lens having a numerical aperture of at least 1.0, is important for the ArF lithography to survive to the 65 nm node, with a further development thereof being accelerated. The lactone ring, which is used as an adhesive group in the prior art ArF resists, has high affinity to water, allowing a problem to arise during immersion in water that more water penetrates into the resist from its surface whereby the resist surface is swollen. By contrast, fluorinated alkyl alcohol has a solubility in alkaline aqueous solution, but a low affinity to neutral water. Thus, the influence of swelling due to immersion can be restrained by introducing a fluorinated alkyl alcohol structure into the base resin.

The resist composition of the invention allows the feature size of the pattern after development to be reduced by various shrinkage techniques. For example, the hole size can be shrunk by such techniques as thermal flow, RELACS, SAFIRE, and WASOOM. More effective shrinkage of hole size is possible particularly when the inventive polymer is blended with a ROMP polymer having a low Tg.

The resist composition comprising the polymer of the invention has a high sensitivity, high resolution, restrained pattern collapse during development, and minimized MEF. Thus the composition is best suited as micropatterning material for the manufacture of VLSI or the like.

DESCRIPTION OF THE PREFERRED EMBODIMENTS

Figure 1:
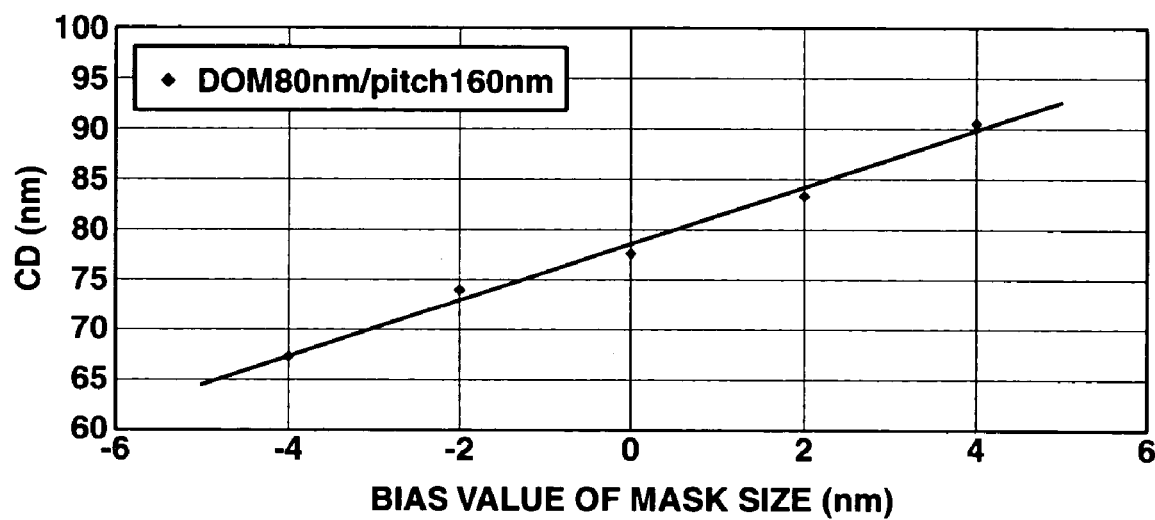
FIG. 1 is a graph showing the results of a MEF test on the resist composition of Example 1, obtained by plotting the bias values of mask size on the abscissa and the CD on the ordinate.

In the structural formulae throughout the specification, Me stands for methyl and Et stands for ethyl. As used herein, the notation (Cn-Cm) means a group containing from n to m carbon atoms per group.

Polymer

The polymer or high molecular weight compound of the invention is a resin which is dissolvable in alkaline developer at a rate that increases under the action of acid. The polymer comprises recurring units of at least one type having the general formula (1) and recurring units of at least one type having the general formula (2).

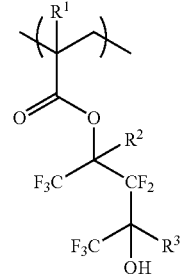

(1)

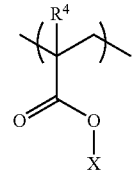

(2)

Herein $R^1$, $R^2$, and $R^4$ are each independently a hydrogen atom or methyl group, $R^3$ is a difluoromethyl group or trifluoromethyl group, and X is a tertiary alkyl group. When an acid acts on the polymer, X is eliminated from the units of formula (2) whereupon the solubility of the polymer in an alkaline developer is increased, that is, the dissolution rate increases as mentioned above.

In formula (1), $R^1$ is a hydrogen atom or methyl group, $R^2$ is a hydrogen atom or methyl group, and $R^3$ is a difluoromethyl group or trifluoromethyl group. Illustrative, non-limiting examples of the recurring units of formula (1) are given below.

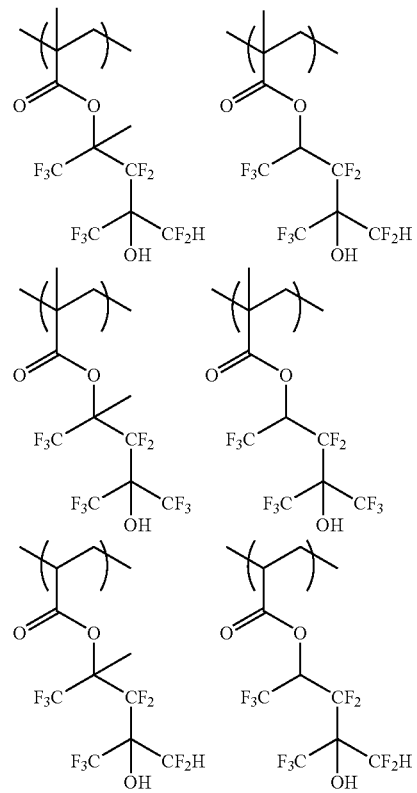

-continued

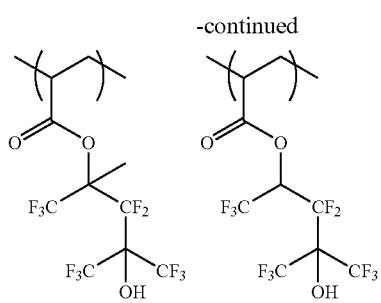

The recurring unit of formula (1) has a heptafluoroalcohol or octafluoroalcohol structure as a partial structure. As used herein, the term "hepafluoroalcohol" and "octafluoroalcohol" refer to alcohols having total seven and eight fluorine atoms on the carbon atoms located adjacent the alcoholic carbon, respectively. As compared with the hexafluoroalcohol which has already been attempted to apply to resist compositions, heptafluoroalcohol and octafluoroalcohol are expected to be strongly acidic and highly water repellent due to a larger number of fluorine atoms attached. Thus heptafluoroalcohol and octafluoroalcohol are expected to exert at least equivalent anti-swelling effect as compared with the hexafluoroalcohol.

The recurring units of formula (1) in the polymer may be of one or more types.

In formula (2), $R^4$ is a hydrogen atom or methyl group, and X is a tertiary alkyl group. As long as it is tertiary, the alkyl group of X may have any number of carbon atoms and be either chain or cyclic, or substituted or unsubstituted. Preferred are chain or cyclic tertiary alkyl groups of 4 to 20 carbon atoms in which one or more methylene groups may be substituted by one or more oxygen atoms, or in which one or more hydrogen atoms may be substituted by one or more hydroxyl groups. Illustrative, non-limiting examples of the partial structure —O—X in formula (2) are given below.

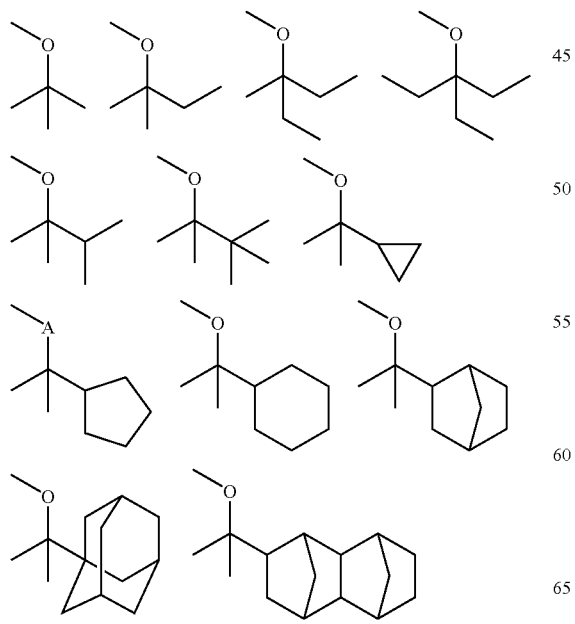

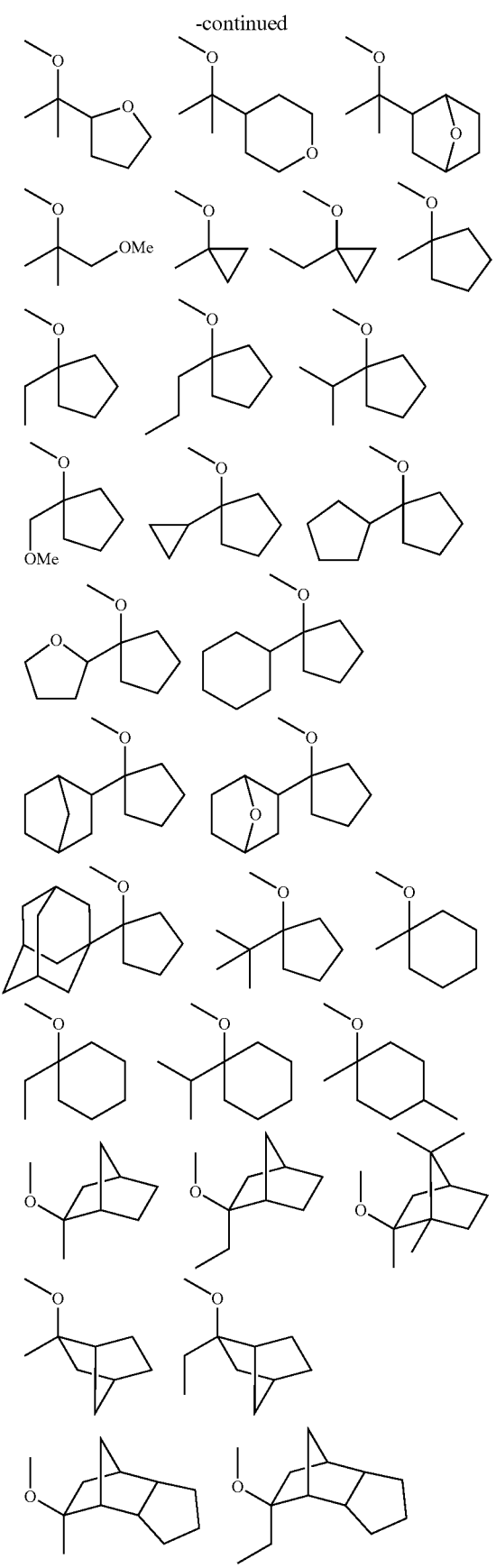

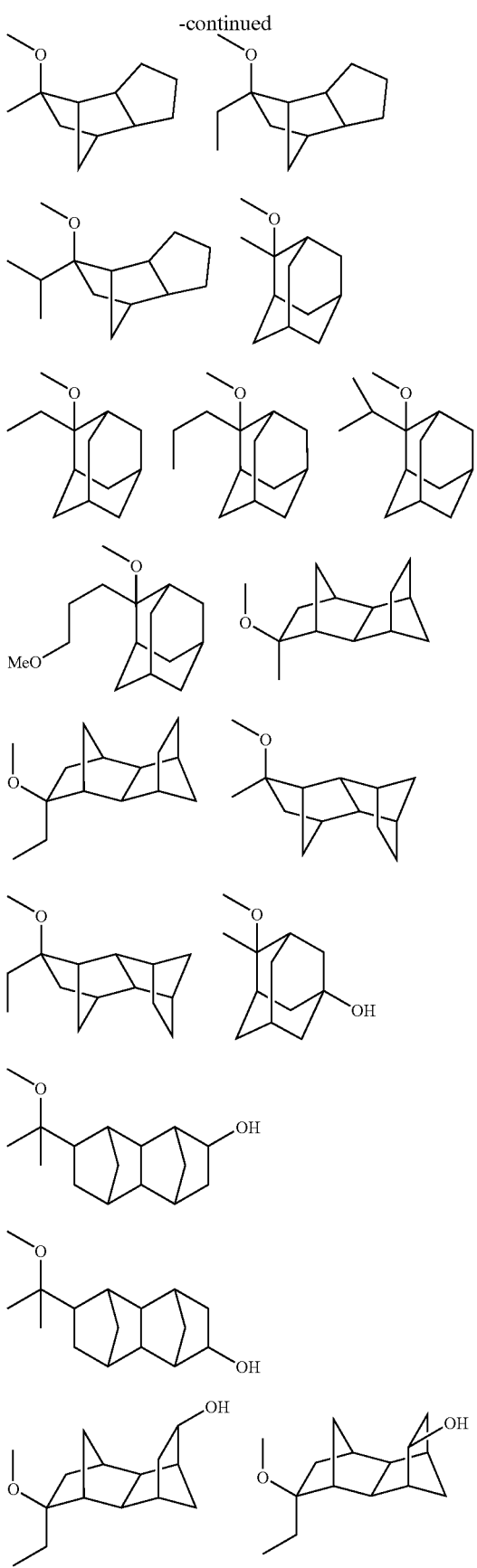

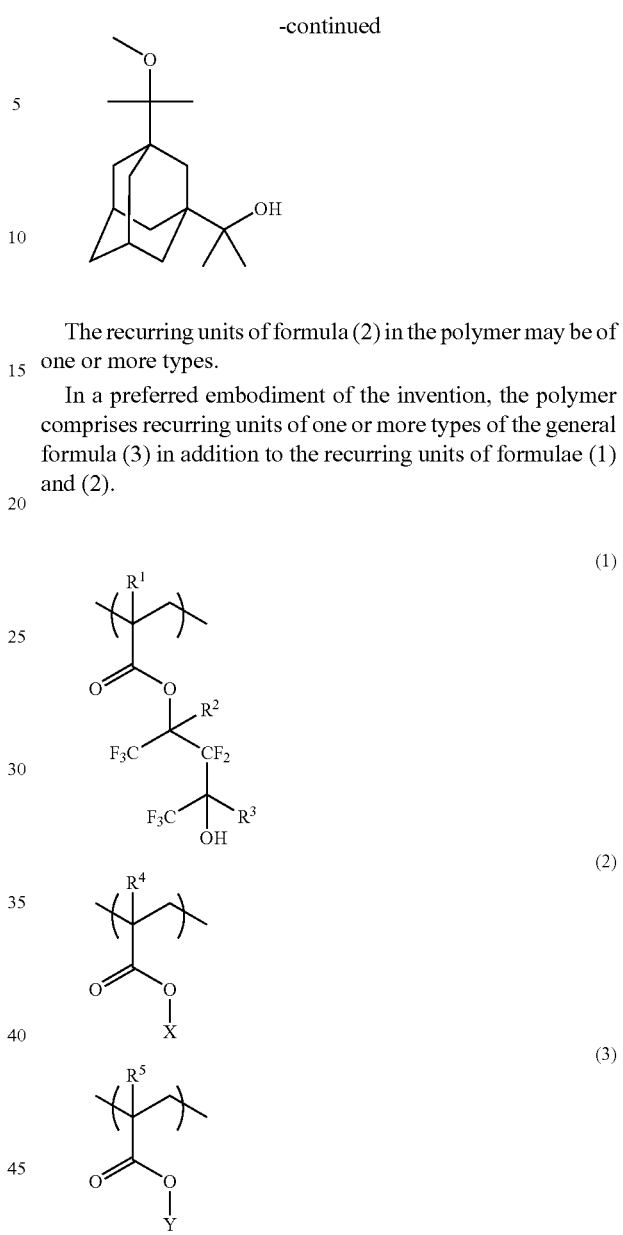

The recurring units of formula (2) in the polymer may be of one or more types.

In a preferred embodiment of the invention, the polymer comprises recurring units of one or more types of the general formula (3) in addition to the recurring units of formulae (1) and (2).

Herein $R^1$, $R^2$, $R^4$, and $R^5$ are each independently a hydrogen atom or methyl group, $R^3$ is a difluoromethyl group or trifluoromethyl group, X is a tertiary alkyl group, and Y is a monovalent group having a lactone structure.

The recurring units of formulae (1) and (2) are as defined and exemplified above. In formula (3), $R^5$ is a hydrogen atom or methyl group, and Y is a monovalent group having a lactone structure.

As long as it has a lactone structure, the monovalent group represented by Y may have any number of carbon atoms and be either monocyclic or polycyclic, or substituted or unsubstituted. Preferred are mono- or polycyclic groups of 4 to 20 carbon atoms having a lactone structure which may contain an ether or ester structure. Illustrative, non-limiting examples of the partial structure —O—Y in formula (3) are given below.

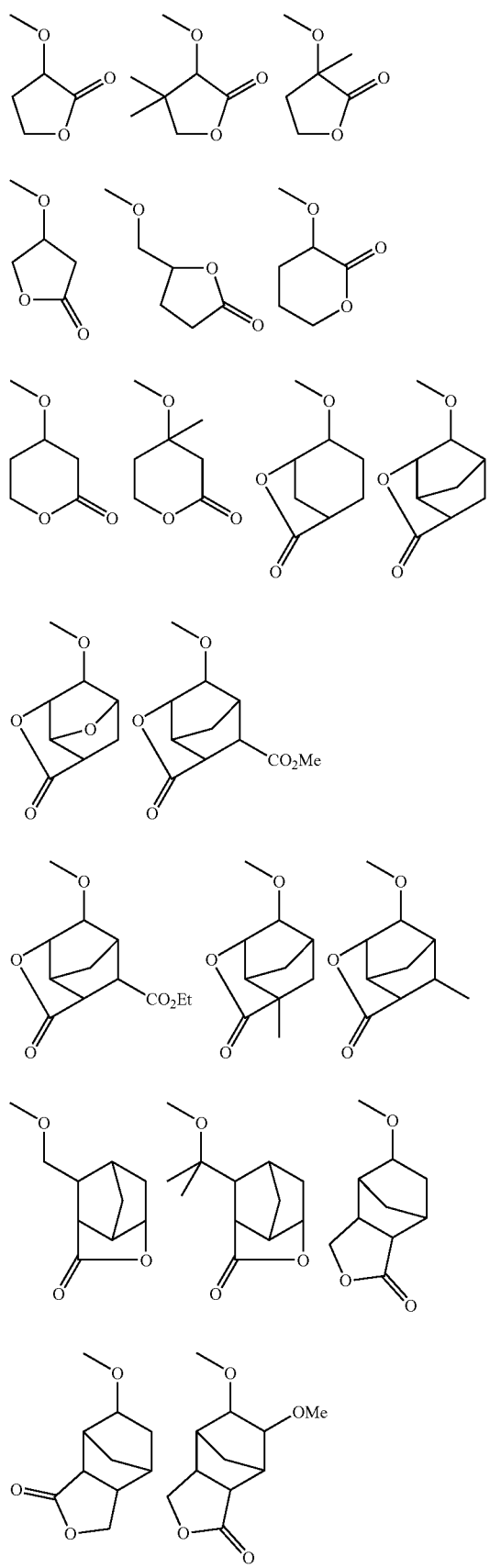
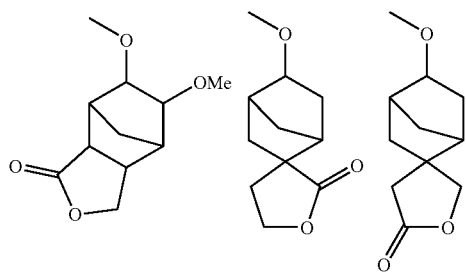
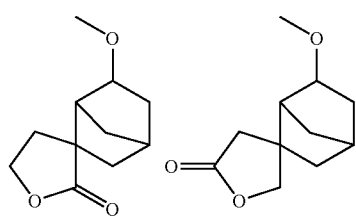
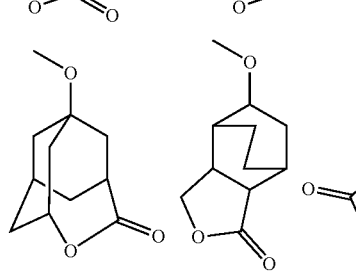
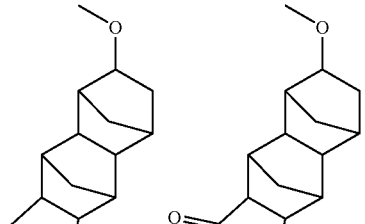
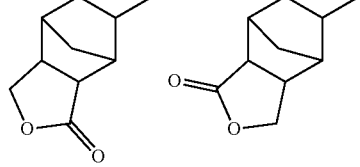

The incorporation of the recurring units of formula (3) improves the substrate adhesion of the resist pattern. The recurring units of formula (3) in the polymer may be of one or more types.

In a further preferred embodiment of the invention, the polymer comprises recurring units of one or more types of the general formula (4) in addition to the recurring units of formulae (1), (2) and (3).

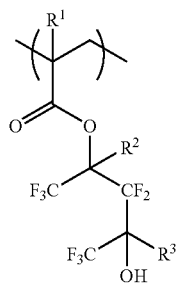

(1)

-continued

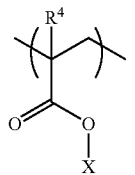  (2)

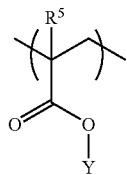  (3)

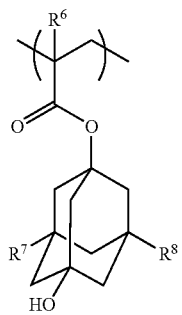  (4)

Herein $R^1$, $R^2$, $R^4$, $R^5$, and $R^6$ are each independently a hydrogen atom or methyl group, $R^3$ is a difluoromethyl group or trifluoromethyl group, $R^7$ and $R^8$ are each independently a hydrogen atom or hydroxyl group, X is a tertiary alkyl group, and Y is a monovalent group having a lactone structure.

The recurring units of formulae (1), (2) and (3) are as defined and exemplified above. In formula (4), $R^6$ is a hydrogen atom or methyl group, $R^7$ and $R^8$ are each independently a hydrogen atom or hydroxyl group. Illustrative, non-limiting examples of the recurring units of formula (4) are given below.

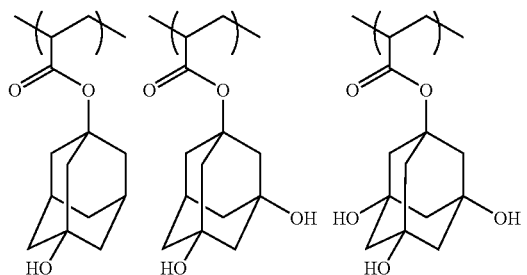
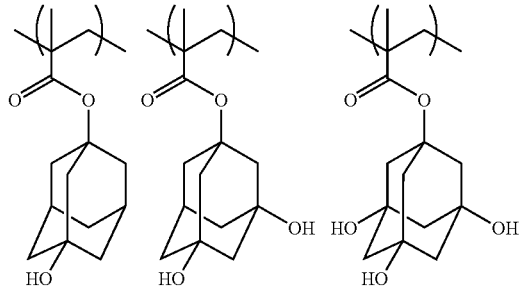

It is believed that the incorporation of the recurring units of formula (4) controls the length of acid diffusion, leading to an improved resolution. The recurring units of formula (4) in the polymer may be of one or more types.

Illustrative, non-limiting examples of the polymer of the invention are given below.

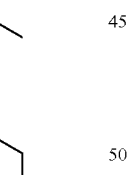

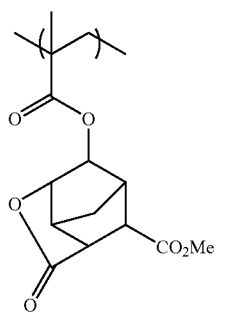
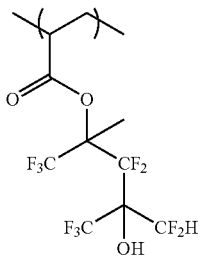
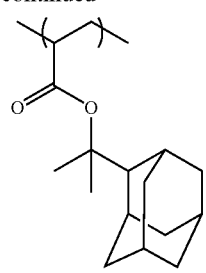
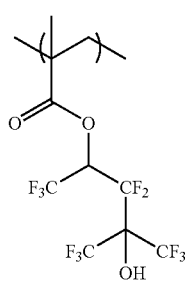
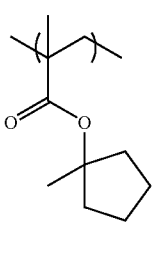
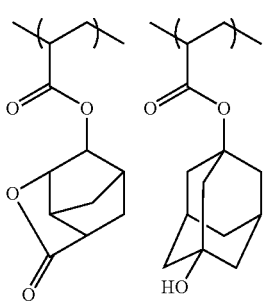
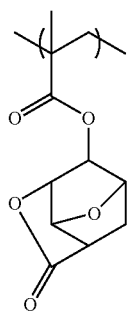
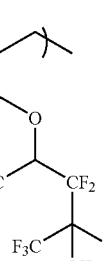
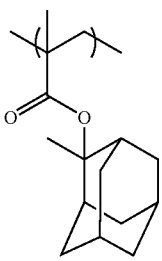
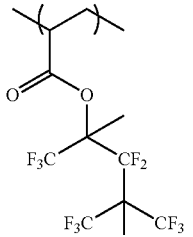
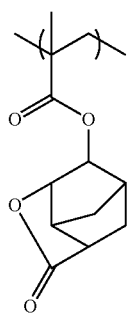
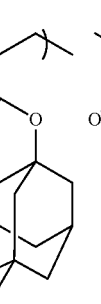
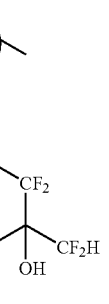
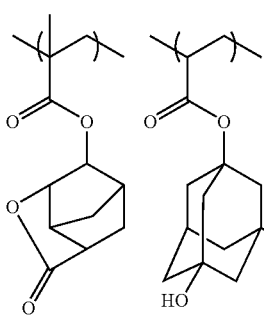
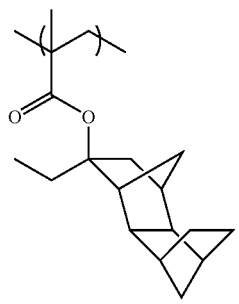
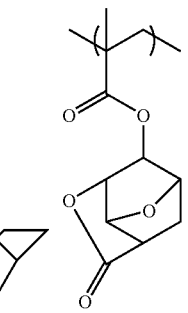
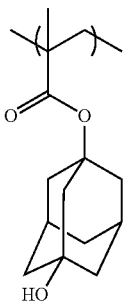
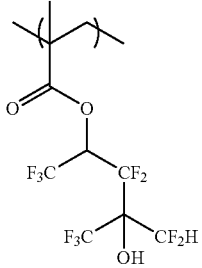
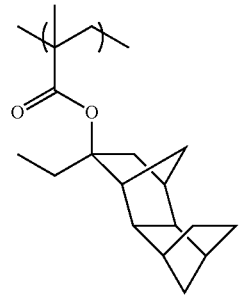

-continued

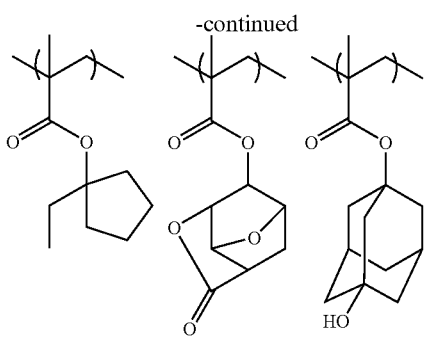

The polymer of the invention should preferably have a weight average molecular weight (Mw) in the range of 1,000 to 50,000, as measured by gel permeation chromatography (GPC) using polystyrene standards. With a Mw less than 1,000, the polymer may be poor in film formation, resolution and heat resistance. With a Mw above 50,000, the polymer may become less dissolvable in developer, leading to a lower resolution. The Mw of the polymer can be controlled to any desired value by properly selecting the formulation of polymerization and purification.

If a polymer has an excess molecular weight distribution or dispersity (Mw/Mn), which indicates the presence of lower and higher molecular weight polymer components, there is a possibility that foreign matter is left on the pattern or the pattern profile is degraded. The influences of molecular weight and dispersity become stronger as the pattern rule becomes finer. Therefore, the multi-component copolymer should preferably have a dispersity (Mw/Mn) of 1.0 to 5.0, especially 1.0 to 2.5, in order to provide a resist composition suitable for micropatterning to a small feature size.

In the polymer, the recurring units of formula (1) are preferably incorporated in a molar fraction of 2% to 70%. Less than 2% of recurring units (1) may fail to exert the effect of incorporation in the polymer whereas more than 70% may lead to too high a rate of dissolution in the unexposed area, detracting from resolution. Also, the recurring units of formula (2) are preferably incorporated in a molar fraction of 10% to 70%. Less than 10% of recurring units (2) may provide a lower rate of dissolution in the exposed area to detract from resolution, whereas more than 70% may increase the length of acid diffusion to detract from resolution. In the embodiment of the polymer containing recurring units of formula (3), their molar fraction is preferably from 5% to 60%. Less than 5% of recurring units (3) may fail to exert the effect of incorporation in the polymer or to fully improve adhesion, whereas more than 60% may detract from the solvent dissolution and resolution of the polymer. In the embodiment of the polymer further containing recurring units of formula (4), their molar fraction is preferably from 5% to 50%. Less than 5% of recurring units (4) may fail to exert the effect of incorporation in the polymer, whereas more than 50% may detract from resolution.

If the molar fractions of the recurring units of formulae (1) to (4) do not total 100%, the polymer of the invention may have additional recurring units incorporated therein. Examples of additional recurring units which can be incorporated herein include those derived from monomers including α,β-unsaturated carboxylic acid esters such as other acrylates, other methacrylates, crotonates, maleates, and itaconates; α,β-unsaturated carboxylic acids such as acrylic acid, methacrylic acid, maleic acid, and itaconic acid; acrylonitrile; methacrylonitrile; α,β-unsaturated lactones such as 5,5-dimethyl-3-methylene-2-oxotetrahydrofuran; cyclic olefins such as norbornene derivatives and tetracyclo [4.4.0.1$^{2,5}$.1$^{7,10}$]dodecene derivatives; α,β-unsaturated carboxylic acid anhydrides such as maleic anhydride and itaconic anhydride; allyl ethers; vinyl ethers; vinyl esters; and vinyl silanes.

The polymer can be synthesized by standard polymerization techniques including radical, anionic and cationic polymerization, preferably radical polymerization. Specifically, a polymer may be obtained by adding acrylate or methacrylate monomers corresponding to the recurring units (1) to (4) to an organic solvent, adding a radical initiator thereto, and allowing radical polymerization to occur. Examples of suitable organic solvents used herein include toluene, benzene, tetrahydrofuran, diethyl ether, dioxane, 2-butanone, ethyl acetate, 1-methoxy-2-propyl acetate, γ-butyrolactone, cyclohexanone, methyl isobutyl ketone and the like, which may be used alone or in admixture. Examples of suitable polymerization initiators used herein include 2,2'-azobisisobutyronitrile (AIBN), 2,2'-azobis(2,4-dimethylvaleronitrile), dimethyl 2,2-azobis(2-methylpropionate), benzoyl peroxide, lauroyl peroxide, and the like. Preferably the reaction mixture is heated to a temperature in the range from 50° C. to the boiling point of the solvent used. The reaction time is usually about 0.5 to 100 hours, and preferably about 1 to 20 hours. If necessary, a thiol compound, disulfide compound or the like may be added as a chain transfer agent during the reaction.

The polymer of the invention can be formulated as the base resin into a positive resist composition, and especially chemically amplified positive working resist composition. It is understood that on use of the polymer as the base resin, a blend of two or more polymers which differ in recurring unit type, compositional ratio, molecular weight or molecular weight distribution is acceptable. The inventive polymer may also be used as a blend with any of conventional polymers including (meth)acrylate copolymers, (meth)acrylate/vinyl ether/maleic anhydride copolymers (VEMA), cycloolefin/maleic anhydride copolymers (COMA), polynorbornene, and hydrogenated cycloolefin ring-opening metathesis polymers (hydrogenated ROMP). In particular, cycloolefin/maleic anhydride copolymers (COMA), polynorbornene, and hydrogenated cycloolefin ring-opening metathesis polymers (hydrogenated ROMP), derived from cycloolefin monomers, are characterized by high etching resistance and a minimal change of pattern feature size with varying PEB temperature (i.e., minimized PEB temperature dependence), and blends thereof with the inventive (meth)acrylate polymers featuring a high resolution lead to resist compositions having both a high resolution and high etching resistance. Illustrative, non-limiting examples of the polymers derived from cycloolefin monomers are given below.

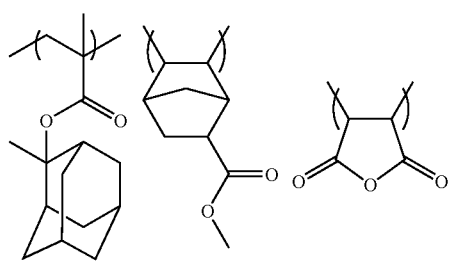

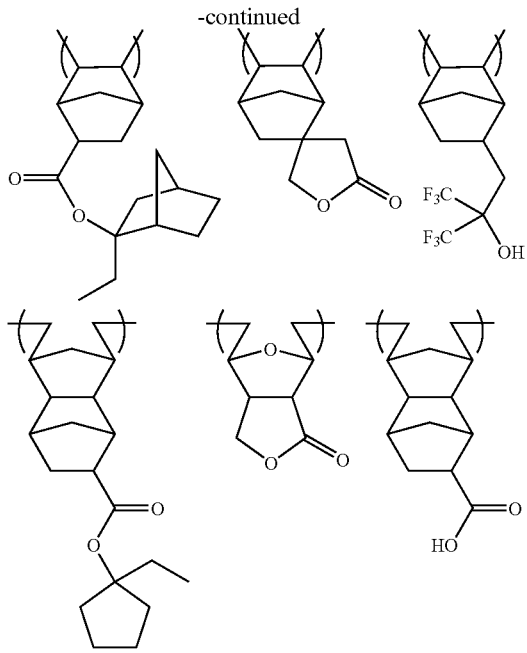

Resist Composition

As mentioned above, the polymer of the invention is suitable as the base resin in a resist composition, and especially chemically amplified positive working resist composition. Therefore, in another aspect, the invention provides a resist composition comprising the polymer, and especially a positive resist composition comprising the polymer. The resist composition of the invention comprises (A) the inventive polymer as a base resin, (B) an acid generator, (C) an organic solvent, and optionally, (D) an organic nitrogen-containing compound, and (E) a surfactant.

As the base resin (A) in the resist composition, if necessary, any of well-known resins having a rate of dissolution in an alkaline developer that increases under the action of acid may be added besides the inventive polymer. It is preferred that the inventive polymer account for 10 to 100% by weight, more preferably 30 to 100% by weight, even more preferably 40 to 100% by weight of the entire base resin.

Acid generator B

As the acid generator (B), a photoacid generator is typically used. It is any compound capable of generating an acid in response to high-energy radiation. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bis-sulfonyldiazomethane compounds and sulfonyl-carbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane, bis(perfluoroisopropylsulfonyl)diazomethane,
bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane,
bis(4-acetyloxyphenylsulfonyl)diazomethane,
bis(4-methanesulfonyloxyphenylsulfonyl)diazomethane,
bis(4-(4-toluenesulfonyloxy)phenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl) diazomethane,
4-methylphenylsulfonylbenzoyldiazomethane,
tert-butylcarbonyl-4-methylphenylsulfonyldiazomethane,
2-naphthylsulfonylbenzoyldiazomethane,
4-methylphenylsulfonyl-2-naphthoyldiazomethane, methylsulfonylbenzoyldiazomethane, and
tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(10-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)-sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyl-oxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethane-sulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)-phenylsulfonyloxyimino)-ethyl)-phenoxy)-propoxy)-phenyl)ethanone oxime(2,5-bis(4-methylphenylsulfonyloxy)-benzenesulfonyloxy)phenylsulfonate).

Also included are the oxime sulfonates described in JP-A 9-95479 and JP-A 9-230588 and the references cited therein, for example, α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile, α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

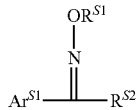

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-1-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include
triphenylsulfonium p-toluenesulfonate,
triphenylsulfonium camphorsulfonate,
triphenylsulfonium pentafluorobenzenesulfonate,
triphenylsulfonium nonafluorobutanesulfonate,
triphenylsulfonium 4-(4'-toluenesulfonyloxy)benzenesulfonate,
triphenylsulfonium 2,4,6-triisopropylbenzenesulfonate,
4-tert-butoxyphenyldiphenylsulfonium p-toluenesulfonate,
4-tert-butoxyphenyldiphenylsulfonium camphorsulfonate,
4-tert-butoxyphenyldiphenylsulfonium 4-(4'-toluenesulfonyloxy)benzenesulfonate,
tris(4-methylphenyl)sulfonium camphorsulfonate,
tris(4-tert-butylphenyl)sulfonium camphorsulfonate,
4-tert-butylphenyldiphenylsulfonium camphorsulfonate,
4-tert-butylphenyldiphenylsulfonium nonafluoro-1-butanesulfonate,
4-tert-butylphenyldiphenylsulfonium pentafluoroethylperfluorocyclohexanesulfonate,
4-tert-butylphenyldiphenylsulfonium perfluoro-1-octanesulfonate,
triphenylsulfonium 1,1-difluoro-2-naphthyl-ethanesulfonate,
triphenylsulfonium 1,1,2,2-tetrafluoro-2-(norbornan-2-yl)ethanesulfonate,
bis(tert-butylsulfonyl)diazomethane,
bis(cyclohexylsulfonyl)diazomethane,
bis(2,4-dimethylphenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)diazomethane,
bis(4-tert-butylphenylsulfonyl)diazomethane,
N-camphorsulfonyloxy-5-norbornene-2,3-dicarboxylic acid imide,
N-p-toluenesulfonyloxy-5-norbornene-2,3-dicarboxylic acid imide,
2-[2,2,3,3,4,4,5,5-octafluoro-1-(nonafluorobutylsulfonyloxyimino)-pentyl]-fluorene,
2-[2,2,3,3,4,4-pentafluoro-1-(nonafluorobutylsulfonyloxyimino)-butyl]-fluorene, and
2-[2,2,3,3,4,4,5,5,6,6-decafluoro-1-(nonafluorobutylsulfonyloxyimino)-hexyl]-fluorene.

In the chemically amplified resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and especially up to 1 part by weight per 100 parts by weight of the base resin. Excessive amounts of the acid-amplifier compound make diffusion control difficult, leading to degradation of resolution and pattern profile.

Organic Solvent C

The organic solvent used herein may be any organic solvent in which the base resin, acid generator, and other components are soluble. Illustrative, non-limiting, examples of the organic solvent include ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 1,000 parts, especially about 400 to 800 parts by weight per 100 parts by weight of the base resin.

Nitrogen-Containing Compound D

The organic nitrogen-containing compound used as component (D) is preferably a compound capable of suppressing the rate of diffusion when the acid generated by the acid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

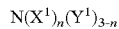

$$N(X^1)_n(Y^1)_{3-n} \qquad (B)\text{-}1$$

In the formula, n is equal to 1, 2 or 3; side chain $Y^1$ is independently hydrogen or a straight, branched or cyclic alkyl group of 1 to 20 carbon atoms which may contain an ether or hydroxyl group; and side chain $X^1$ is independently selected from groups of the following general formulas (Xa)-1 to (Xa)-3, and two or three $X^1$'s may bond together to form a ring.

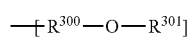

(Xa)-1

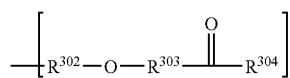

(Xa)-2

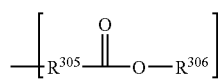

(Xa)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4,1-aza-15-crown-5,1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl] ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis [2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl) amine, tris(ethoxycarbonylmethyl)amine, N-butyl-bis (methoxycarbonylmethyl)amine, N-hexyl-bis (methoxycarbonylmethyl)amine, and β-(diethylamino)-δ-valerolactone.

Also useful are one or more organic nitrogen-containing compounds having cyclic structure represented by the following general formula (B)-2.

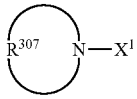

(B)-2

Herein $X^1$ is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, and 2-morpholinoethyl cyclohexanecarboxylate.

Also, one or more organic nitrogen-containing compounds having cyano group represented by the following general formulae (B)-3 to (B)-6 may be blended.

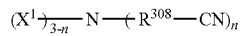

(B)-3

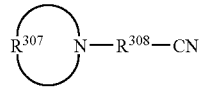

(B)-4

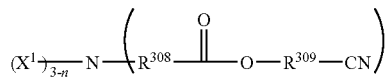

(B)-5

(B)-6

Herein, $X^1$, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

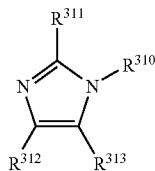
(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

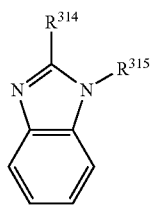
(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

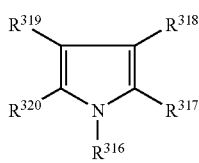
(B)-9

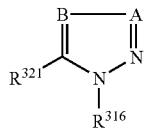
(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

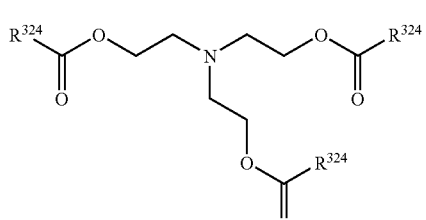
(B)-11

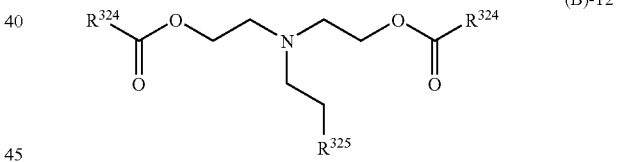
(B)-12

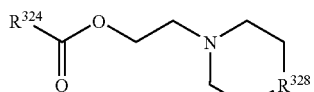
(B)-13

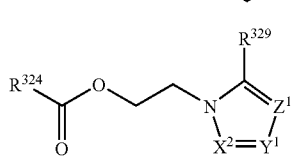
(B)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)m- group wherein m is 0, 1, 2, 3 or 4. R$^{329}$ is hydrogen, methyl, ethyl or phenyl. X$^2$ is a nitrogen atom or CR$^{330}$. Y$^1$ is a nitrogen atom or CR$^{331}$. Z$^1$ is a nitrogen atom or CR$^{332}$. R$^{330}$, R$^{331}$ and R$^{332}$ are each independently hydrogen, methyl or phenyl. Alternatively, a pair of R$^{330}$ and R$^{331}$ or a pair of R$^{331}$ and R$^{332}$ may bond together to form a C$_6$-C$_{20}$ aromatic ring or C$_2$-C$_{20}$ hetero-aromatic ring.

Further included are organic nitrogen-containing compounds of 7-oxanorbornane-2-carboxylic ester structure having the general formula (B)-15.

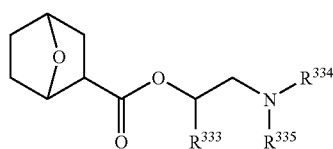

(B)-15

Herein R$^{333}$ is hydrogen or a straight, branched or cyclic C$_1$-C$_{10}$ alkyl group. R$^{334}$ and R$^{335}$ are each independently a C$_1$-C$_{20}$ alkyl group, C$_6$-C$_{20}$ aryl group or C$_7$-C$_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. R$^{334}$ and R$^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the entire base resin. Less than 0.001 part of the nitrogen-containing compound achieves no or little addition effect whereas more than 2 parts would result in too low a sensitivity.

Surfactant E

To the resist composition of the invention, a surfactant (E) may be added as often employed for the purpose of improving the coating characteristics. As long as the benefits of the invention are not compromised, the surfactant may be added in ordinary amounts, preferably 0.001 to 0.1% by weight of the entire organic solvent.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M Co., Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dainippon Ink & Chemicals, Inc., and X-70-092 and X-70-093 from Shin-Etsu Chemical Co., Ltd. Preferred surfactants are Fluorad FC-430 from Sumitomo 3M Co., Ltd., KH-20, KH-30 from Asahi Glass Co., Ltd., and X-70-093 from Shin-Etsu Chemical Co., Ltd.

While the resist composition of the invention is basically composed of the inventive polymer, the acid generator, the organic solvent, the organic nitrogen-containing compound and the surfactant as described above, it may further include any well-known components such as dissolution inhibitors, acidic compounds, stabilizers, and dyes, if necessary. Such optional components are added in any desired amounts insofar as the benefits of the invention are not impaired.

Using the resist composition of the invention, patterns may be formed by any known lithographic technique. Typically, the composition is applied onto a substrate (e.g., Si, SiO$_2$, SiN, SiON, TiN, WSi, BPSG, SOG, organic anti-reflective film, Cr, CrO, CrON, MoSi, etc.) for microfabrication by a suitable coating technique such as spin coating, roll coating, flow coating, dip coating, spray coating or doctor coating. The coating is prebaked on a hot plate at a temperature of 60 to 150° C. for about 0.1 to 10 minutes, preferably 80 to 140° C. for 0.5 to 5 minutes. The resulting resist film is generally 0.05 to 2.0 μm thick. A patterning mask having the desired pattern may then be placed over the resist film, and the resist film is then exposed to radiation, preferably having an exposure wavelength of up to 300 nm, such as UV, deep-UV, excimer laser light, electron beam, x-ray, γ-ray and synchrotron radiation. The exposure dose is preferably in the range of about 1 to 200 mJ/cm$^2$, more preferably about 10 to 100 mJ/cm$^2$. Light exposure may be done by a conventional exposure process or in some cases, by an immersion lithography process of providing a liquid fill, typically water, between the projection lens and the resist. In the case of immersion lithography, if necessary, a topcoat may be applied onto the resist film before exposure, which is generally know as "top coating process." The resist film is then post-exposure baked (PEB) on a hot plate at 60 to 150° C. for 0.1 to 5 minutes, and preferably at 80 to 140° C. for 0.5 to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional method such as dip, puddle, or spray technique for a period of 0.1 to 3 minutes, and preferably 0.5 to 2 minutes. These steps result in the formation of the desired pattern on the substrate. If necessary, the pattern as developed can be heat treated for adjusting the pattern size, which is generally known as "thermal flow process." Of the various types of high-energy radiation that may be used, the resist composition of the invention is best suited to micropattern formation with, in particular, deep-UV rays having a wavelength of 260 to 120 nm or excimer laser beams, extremely short UV, x-rays or electron beams.

EXAMPLE

Examples of the invention are given below by way of illustration and not by way of limitation. The abbreviations used herein are Mw for weight average molecular weight, Mn for number average molecular weight, Mw/Mn for molecular weight distribution or dispersity, and PGMEA for propylene glycol monomethyl ether acetate. For all polymers, Mw and Mn are determined by gel permeation chromatography (GPC) versus polystyrene standards.

[Monomer Synthesis]

Fluorinated alcohol monomers from which polymers of the invention are derived can be synthesized, for example, by the following processes.

Monomer Synthesis Example 1

Synthesis of 2,2,4,4,4-pentafluoro-3-hydroxy-1,3-bis(trifluoromethyl) butyl methacrylate

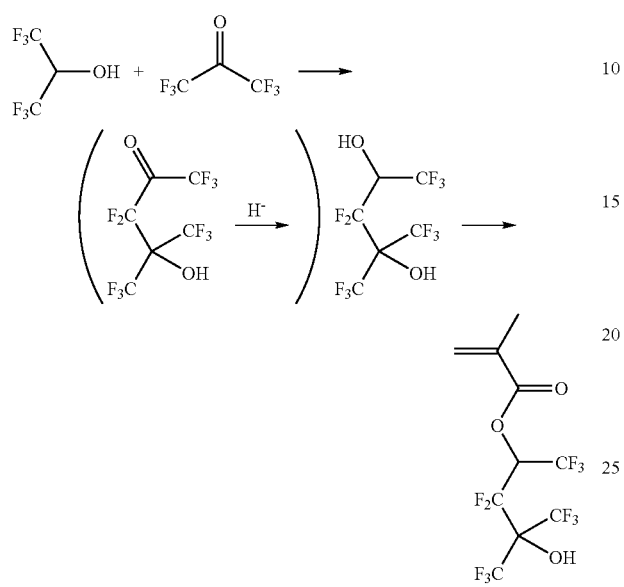

[1-1] Synthesis of 1,1,1,3,3,5,5,5-octafluoro-2-(trifluoromethyl)pentane-2,4-diol With stirring in a nitrogen blanket, a mixture of 109 g of 1,1,1,3,3,3-hexafluoro-2-propanol and 500 g of tetrahydrofuran was cooled at 5° C. To the mixture, 500 mL of a solution of 2.71M n-butyllithium in n-hexane was added dropwise, followed by stirring for 2 hours at 5° C. 119 g of hexafluoroacetone was admitted to the reaction solution, which was stirred for 3 hours at 5° C. A mixture of 37.0 g of sodium borohydride and 800 g of water was added dropwise to the reaction mixture, which was stirred for 10 hours at room temperature. 330 g of 20% aqueous hydrochloric acid was added to the reaction mixture to quench the reaction, followed by conventional work-up steps of washing, drying and concentration to give a crude product. It was purified by silica gel column chromatography, yielding 138 g (yield 67%) of the end compound, 1,1,1,3,3,5,5,5-octafluoro-2-(trifluoromethyl)pentane-2,4-diol.

[1-2] Synthesis of 2,2,4,4,4-pentafluoro-3-hydroxy-1,3-bis(trifluoromethyl)butyl methacrylate To a mixture of 138 g of 1,1,1,3,3,5,5,5-octafluoro-2-(trifluoromethyl)pentane-2,4-diol (Synthesis Example [1-1]), 53.0 g of triethylamine, and 700 g of toluene, under ice cooling and with stirring, 45.4 g of methacrylic acid chloride was added dropwise. The mixture was stirred for 2 hours. Water was added to the reaction mixture to quench the reaction, followed by conventional work-up steps of washing, drying and concentration to give a crude product. It was purified by silica gel column chromatography, yielding 119 g (yield 71%) of the end compound, fluorinated ester.

Monomer Synthesis Example 2

Synthesis of 2,2,4,4,4-pentafluoro-3-hydroxy-1,3-bis(trifluoromethyl)butyl acrylate

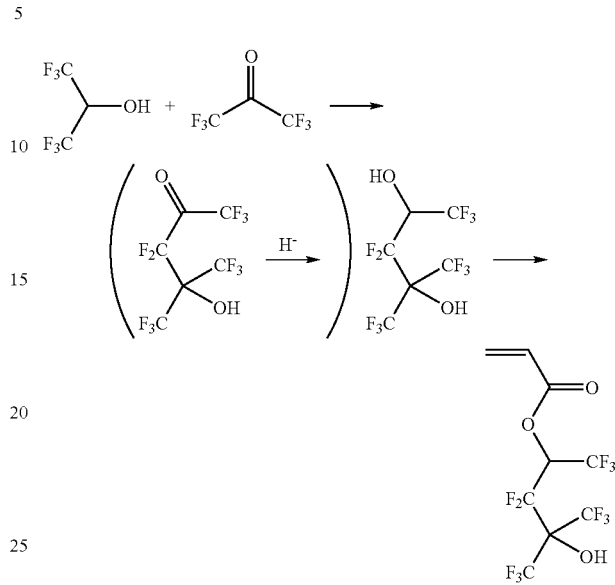

The procedure of Monomer Synthesis Example 1 was repeated except that acrylic acid chloride was used instead of the methacrylic acid chloride in stage [1-2], yielding 2,2,4,4,4-pentafluoro-3-hydroxy-1,3-bis(trifluoromethyl)butyl acrylate.

Monomer Synthesis Example 3

Synthesis of 2,2,4,4,4-pentafluoro-3-hydroxy-1-methyl-1,3-bis(trifluoromethyl)butyl methacrylate

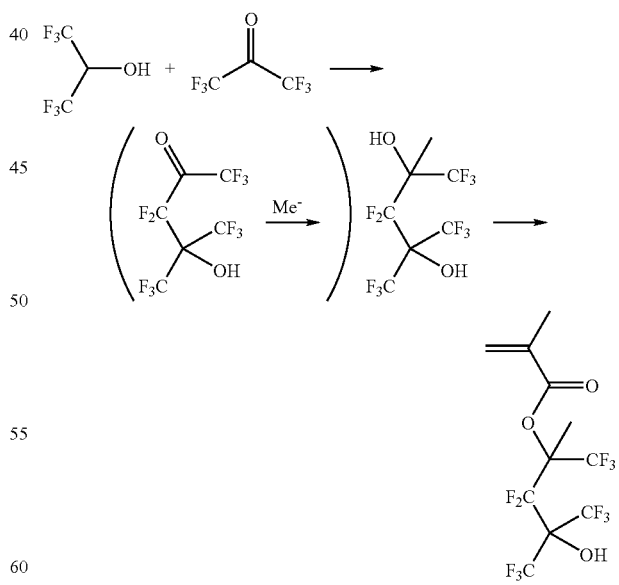

The procedure of Monomer Synthesis Example 1 was repeated except that a tetrahydrofuran solution of methylmagnesium chloride was used instead of the mixture of sodium borohydride and water in stage [1-1], yielding 2,2,4,4-pentafluoro-3-hydroxy-1-methyl-1,3-bis(trifluoromethyl)butyl methacrylate.

Monomer Synthesis Example 4

Synthesis of 2,2,4,4,4-pentafluoro-3-hydroxy-1-methyl-1,3-bis(trifluoromethyl)butyl acrylate

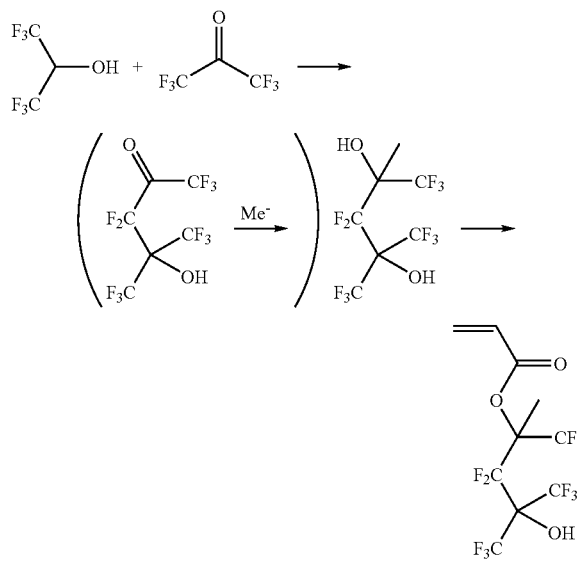

The procedure of Monomer Synthesis Example 1 was repeated except that a tetrahydrofuran solution of methylmagnesium chloride was used instead of the mixture of sodium borohydride and water in stage [1-1] and acrylic acid chloride was used instead of the methacrylic acid chloride in stage [1-2], yielding 2,2,4,4,4-pentafluoro-3-hydroxy-1-methyl-1,3-bis(trifluoromethyl)butyl acrylate.

Monomer Synthesis Example 5

Synthesis of 3-(difluoromethyl)-2,2,4,4,4-pentafluoro-3-hydroxy-1-(trifluoromethyl)butyl methacrylate

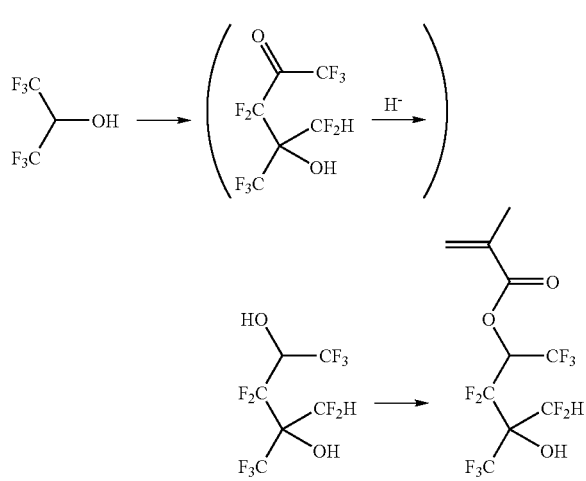

[5-1] Synthesis of 2-(difluoromethyl)-1,1,1,3,3,5,5,5-octafluoropentane-2,4-diol With stirring in a nitrogen blanket, a mixture of 109 g of 1,1,1,3,3,3-hexafluoro-2-propanol and 500 g of tetrahydrofuran was cooled at 5° C. To the mixture, 500 mL of a solution of 2.71M n-butyllithium in n-hexane was added dropwise, followed by stirring for 2 hours at 5° C. 11.9 g of hydrogen chloride was admitted to the reaction solution, which was stirred for 2 hours. A mixture of 25 g of sodium borohydride and 800 g of water was added dropwise to the reaction mixture, which was stirred for 24 hours at room temperature. 260 g of 20% aqueous hydrochloric acid was added to the reaction mixture to quench the reaction, followed by conventional work-up steps of washing, drying and concentration to give a crude product. It was purified by distillation under reduced pressure, yielding 53 g (yield 55%) of the end diol compound.

[5-2] Synthesis of 3-(difluoromethyl)-2,2,4,4,4-pentafluoro-3-hydroxy-1-(trifluoromethyl)butyl methacrylate Reaction was carried out as in stage [1-2] of Monomer Synthesis Example 1 except that the diol compound obtained in [5-1] was used instead of the diol compound obtained in [1-1]. The resulting crude product was purified by distillation under reduced pressure, obtaining the end compound, fluorinated ester in a yield of 78%.

Monomer Synthesis Example 6

Synthesis of 3-(difluoromethyl)-2,2,4,4,4-pentafluoro-3-hydroxy-1-(trifluoromethyl)butyl acrylate

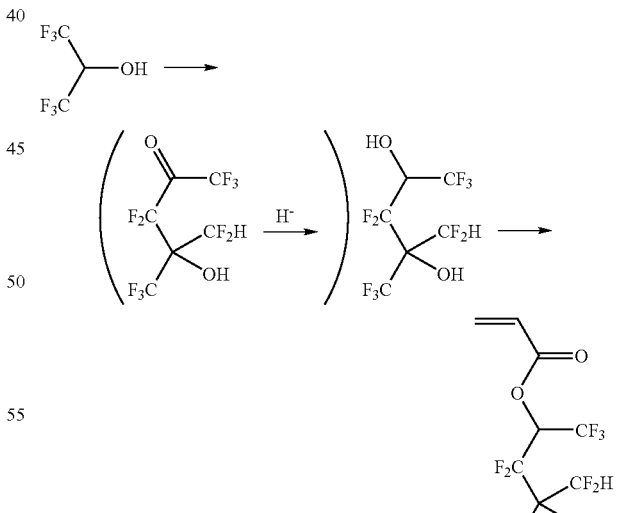

The procedure of Monomer Synthesis Example 5 was repeated except that acrylic acid chloride was used instead of the methacrylic acid chloride in stage [5-2], yielding 3-(difluoromethyl)-2,2,4,4,4-pentafluoro-3-hydroxy-1-(trifluoromethyl)butyl acrylate.

Monomer Synthesis Example 7

Synthesis of 3-(difluoromethyl)-2,2,4,4,4-pentafluoro-3-hydroxy-1-methyl-1-(trifluoromethyl)butyl methacrylate

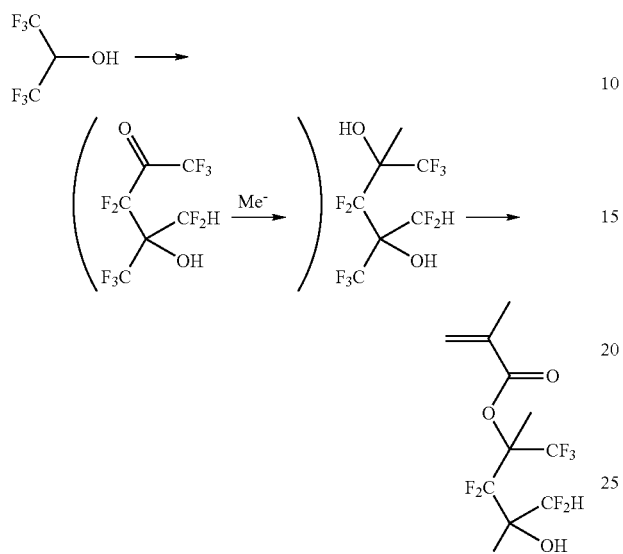

The procedure of Monomer Synthesis Example 5 was repeated except that a tetrahydrofuran solution of methylmagnesium chloride was used instead of the mixture of sodium borohydride and water in stage [5-1], yielding 3-(difluoromethyl)-2,2,4,4,4-pentafluoro-3-hydroxy-1-methyl-1-(trifluoromethyl)butyl methacrylate.

Monomer Synthesis Example 8

Synthesis of 3-(difluoromethyl)-2,2,4,4,4-pentafluoro-3-hydroxy-1-methyl-1-(trifluoromethyl)butyl acrylate

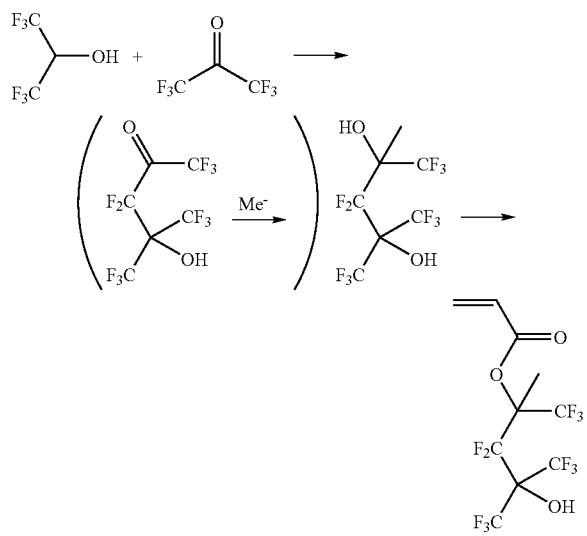

The procedure of Monomer Synthesis Example 5 was repeated except that a tetrahydrofuran solution of methylmagnesium chloride was used instead of the mixture of sodium borohydride and water in stage [5-1], and acrylic acid chloride was used instead of the methacrylic acid chloride in stage [5-2], yielding 3-(difluoromethyl)-2,2,4,4,4-pentafluoro-3-hydroxy-1-methyl-1-(trifluoromethyl)butyl acrylate.

[Polymer Synthesis]

Synthesis Examples are given below for illustrating the synthesis of polymers of the invention, but are not to be construed as limiting the invention thereto.

Polymer Synthesis Example 1

Synthesis of Polymer 1

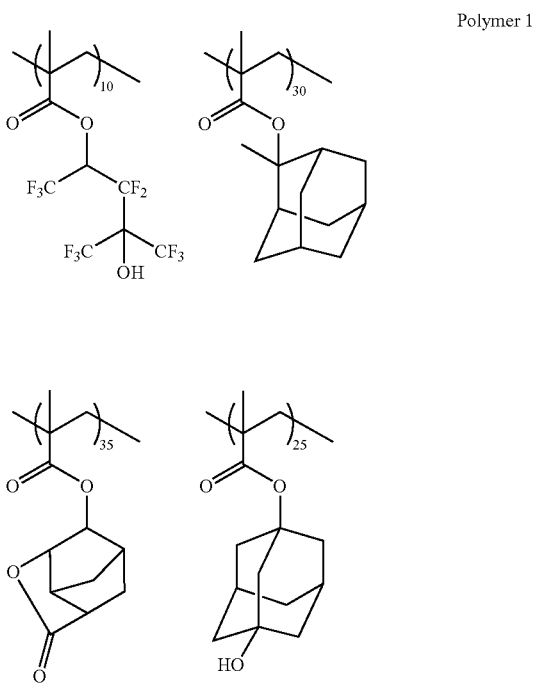

Polymer 1

In a reactor, 50.0 g of 2-butanone was heated and stirred. A mixture of 3.13 g of 2,2,4,4,4-pentafluoro-3-hydroxy-1,3-bis(trifluoromethyl)butyl methacrylate, 5.73 g of 2-methyl-2-adamantyl methacrylate, 4.81 g of 3-hydroxy-1-adamantyl mechacrylate, 6.33 g of 3-oxo-2-oxatricyclo[4.2.1.0$^{4,8}$] nonan-9-yl methacrylate, 268 mg of 2,2'-azobisisobutyronitrile, 127 mg of 2-mercaptoethanol, and 100.0 g of 2-butanone was added dropwise over 4 hours. Reaction took place for a further 2 hours. To 400 g of hexane being stirred, the reaction solution was added dropwise. The resulting precipitate was collected by filtration, washed with hexane, and dried under reduced pressure at 50° C. for 18 hours, obtaining 16.2 g (yield 81%) of the target polymer, designated Polymer 1.

Mw: 9,200

Mw/Mn: 2.10

Polymer Synthesis Examples 2 to 5
Synthesis of Polymers 2 to 5
Polymers 2 to 5, identified below, were prepared as in Polymer Synthesis Example 1.
Polymer 2
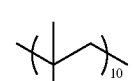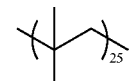
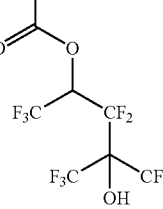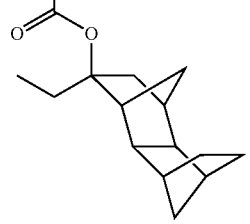
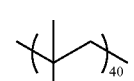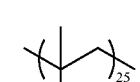
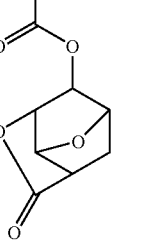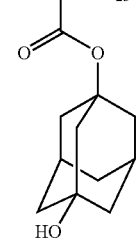
Mw: 8,400
Mw/Mn: 2.05
Polymer 3
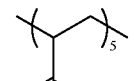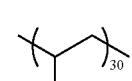
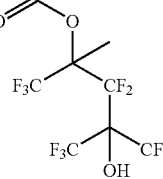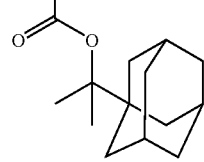
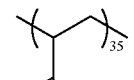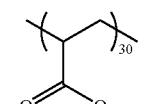
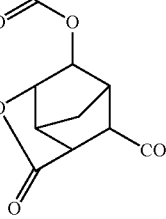
Mw: 10,500
Mw/Mn: 2.20
Polymer 4
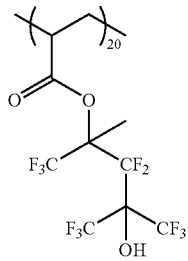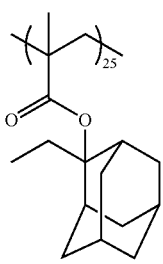
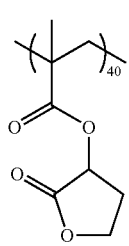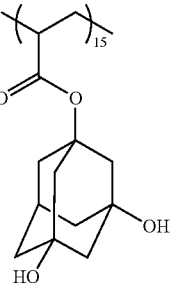
Mw: 10,300
Mw/Mn: 2.21
Polymer 5
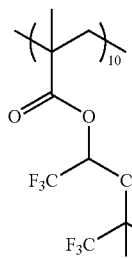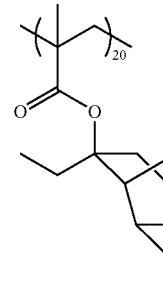
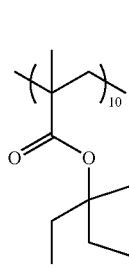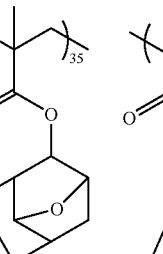
Mw: 8,800
Mw/Mn: 2.13

Comparative Polymer Synthesis Examples 1 to 3

Synthesis of Polymers 6 to 8

Polymers 6 to 8, identified below, were prepared as in Polymer Synthesis Example 1.

Polymer 6

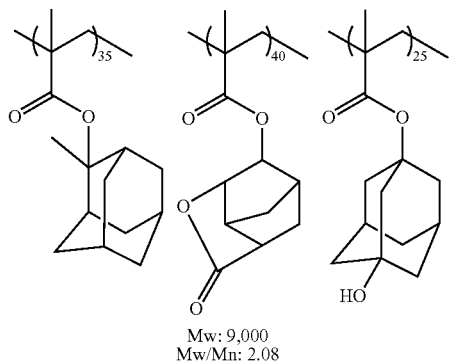

Mw: 9,000
Mw/Mn: 2.08

Polymer 7

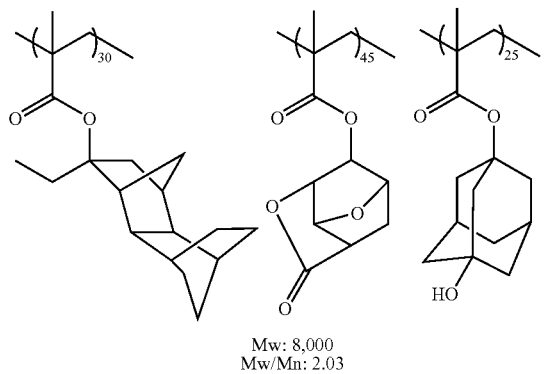

Mw: 8,000
Mw/Mn: 2.03

Polymer 8

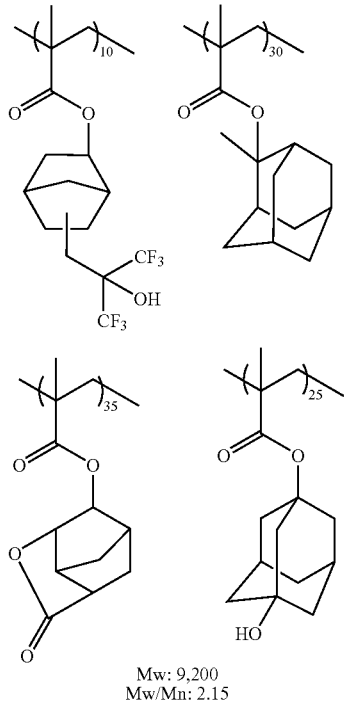

Mw: 9,200
Mw/Mn: 2.15

EXAMPLES AND COMPARATIVE EXAMPLES

Preparation of Chemically Amplified Resist Composition and Patterning

Example 1

A resist composition was prepared by using the polymer obtained in Polymer Synthesis Example 1 (Polymer 1), dissolving it in a solvent together with other components in accordance with the formulation shown below and passing through a Teflon® filter with a pore size of 0.2 μm. The solvent contained 0.01 wt % of a surfactant KH-20 (Asahi Glass Co., Ltd.).

| | | |
|---|---|---|
| (A) | Base resin (Polymer 1) | 80 pbw |
| (B) | Acid generator (PAG1) | 7.5 pbw |

PAG 1

| | | |
|---|---|---|
| (C) | Solvent (a mixture of 560 pbw PGMEA and 240 pbw cyclohexanone) | 800 pbw |
| (D) | Nitrogen-containing compound (Amine 1) | 0.53 pbw |

Amine 1

On a silicon wafer having an antireflective coatings of ARC29A (Nissan Chemical Co., Ltd.) coated to a thickness of 78 nm, the resist solution was spin coated, then baked at 120° C. for 60 seconds to give a resist film having a thickness of 170 nm. The resist film was exposed by means of an ArF excimer laser stepper model NSR-S307E (Nikon Corp., NA 0.85, σ0.80, ¾ annular illumination, 6% half-tone phase shift mask). After the exposure, the resist film was baked (PEB) at 120° C. for 60 seconds, cooled to 23° C., and then puddle developed in a 2.38 wt % aqueous solution of tetramethylammonium hydroxide at 23° C. for 30 seconds, obtaining a line-and-space pattern.

Examples 2 to 5 and Comparative Examples 1 to 3

For the polymers obtained in Polymer Synthesis Examples 2 to 5 (Polymers 2 to 5) and the comparative polymers (Polymers 6 to 8), resist compositions were prepared as in Example 1 by compounding 80 parts by weight of each polymer as the base resin. Patterns were similarly formed therefrom. It is noted that the PEB was at an optimum temperature selected for a particular resist composition.

Evaluation (1) Resolution

The patterned wafer was observed under a top-down scanning electron microscope (SEM), determining the optimum exposure dose (mJ/cm$^2$) which provided a 1:1 resolution to a 100-nm 1:1 line-and-space pattern. Maximum resolution is the minimum line width (nm) of a L/S pattern which was ascertained separate at the optimum exposure dose. Smaller values of maximum resolution are better.

(2) MEF

The patterned wafer was observed under a top-down SEM, determining the exposure dose (mJ/cm$^2$) which provided a 1:1 resolution to a 80-nm 1:1 line-and-space pattern. Exposure was performed at this exposure dose through a mask with five L/S patterns in which the mask size of line was biased from 80 nm by −4 nm, −2 nm, ±0 nm, +2 nm, and +4 nm while the pattern pitch was fixed at 160 nm. The critical dimension (CD) of the finished line was measured. From a diagram where the bias values of mask size are plotted on the abscissa and the CD on the ordinate, a straight line resulting from linear approximation was determined for gradient as MEF. Smaller values of MEF are better. FIG. 1 is a graph showing the results of a MEF test on the resist composition of Example 1.

(3) Pattern Collapse

While the line pattern was narrowed by using intentionally excess exposure doses, it was observed under top-down SEM to what size the pattern can maintain its shape without collapse. The minimum size represents pattern collapse durability. Smaller size values are better.

Based on the test results, Table 1 summarizes the maximum resolution, MEF and pattern collapse durability of the resist compositions of Examples and Comparative Examples.

TABLE 1

| | Polymer | Maximum resolution | MEF | Pattern collapse durability |
|---|---|---|---|---|
| Example 1 | Polymer 1 | 75 nm | 2.8 | 49 nm |
| Example 2 | Polymer 2 | 75 nm | 2.6 | 47 nm |
| Example 3 | Polymer 3 | 75 nm | 2.7 | 51 nm |
| Example 4 | Polymer 4 | 75 nm | 2.7 | 49 nm |
| Example 5 | Polymer 5 | 75 nm | 2.5 | 47 nm |
| Comparative Example 1 | Polymer 6 | 80 nm | 3.3 | 60 nm |
| Comparative Example 2 | Polymer 7 | 80 nm | 3.2 | 59 nm |
| Comparative Example 3 | Polymer 8 | 80 nm | 3.4 | 55 nm |

As is evident from Table 1, resist compositions using inventive polymers are excellent in resolution, MEF and pattern collapse durability, proving that they are best suited as the micropatterning material in the microfabrication of VLSI or photomask patterns.

Japanese Patent Application No. 2005-316400 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer of which dissolution rate in an alkaline developer increases under the action of acid, said polymer comprising recurring units having the following formulae (i) or (ii):

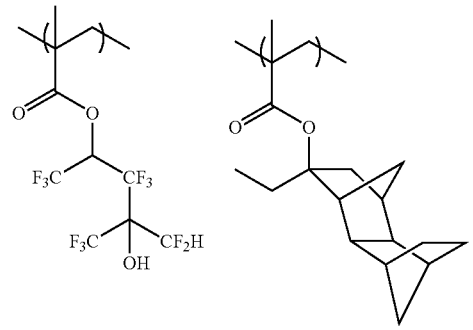

(i)

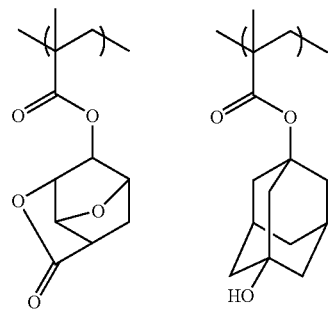

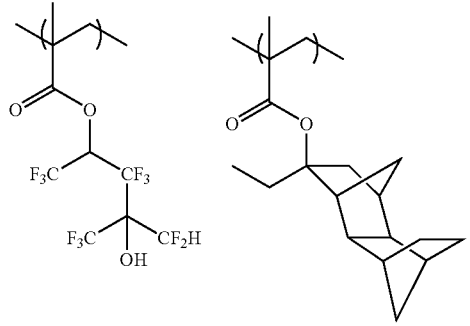

(ii)

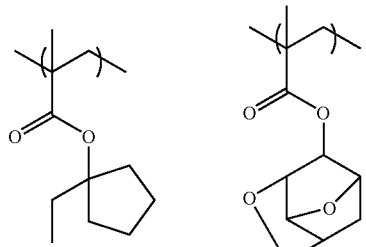

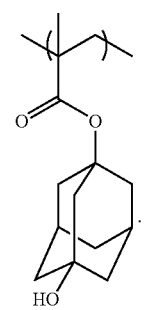

2. A resist composition comprising the polymer of claim 1.

3. A resist composition comprising
(A) the polymer of claim 1,
(B) an acid generator, and
(C) an organic solvent.

4. A resist composition comprising
(A) the polymer of claim 1,
(B) an acid generator,
(C) an organic solvent, and
(D) an organic nitrogen-containing compound.

5. A resist composition comprising
(A) the polymer of claim 1,
(B) an acid generator,
(C) an organic solvent,
(D) an organic nitrogen-containing compound, and
(E) a surfactant.

6. A process for forming a pattern comprising the steps of (1) applying the resist composition of claim 3 onto a substrate, (2) heat treating and exposing to high-energy radiation having a wavelength of up to 300 nm or electron beams through a photomask, (3) heat treating and developing with a developer.

* * * * *